United States Patent
Cohen et al.

(10) Patent No.: US 10,062,567 B2
(45) Date of Patent: Aug. 28, 2018

(54) REDUCING AUTODOPING OF III-V SEMICONDUCTORS BY ATOMIC LAYER EPITAXY (ALE)

(71) Applicant: International Business Machines Corporation, Armonk, NY (US)

(72) Inventors: Guy M. Cohen, Ossining, NY (US); Christian Lavoie, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 14/755,636

(22) Filed: Jun. 30, 2015

(65) Prior Publication Data

US 2017/0004969 A1    Jan. 5, 2017

(51) Int. Cl.
*C30B 29/40* (2006.01)
*H01L 21/02* (2006.01)
*C30B 25/16* (2006.01)

(52) U.S. Cl.
CPC ...... *H01L 21/02546* (2013.01); *C30B 25/165* (2013.01); *C30B 29/40* (2013.01); *H01L 21/0262* (2013.01); *H01L 21/02392* (2013.01); *H01L 21/02576* (2013.01); *H01L 21/02579* (2013.01); *H01L 21/0254* (2013.01); *H01L 21/02543* (2013.01); *H01L 21/02549* (2013.01)

(58) Field of Classification Search
CPC .... C23C 14/0617; C30B 29/40; C30B 25/165
USPC ........................................................ 428/457
See application file for complete search history.

(56) References Cited

U.S. PATENT DOCUMENTS

| | | | | |
|---|---|---|---|---|
| 4,058,430 | A | * 11/1977 | Suntola | C23C 14/02 117/105 |
| 4,780,748 | A | * 10/1988 | Cunningham | H01L 21/02395 257/24 |
| 4,845,049 | A | * 7/1989 | Sunakawa | H01L 21/02395 117/105 |
| 4,859,627 | A | * 8/1989 | Sunakawa | H01L 21/02392 117/105 |
| 8,415,751 | B2 | 4/2013 | Mukherjee et al. | |
| 2014/0159120 | A1 | 6/2014 | Ahmed | |
| 2015/0017794 | A1 | 1/2015 | Takamure et al. | |

FOREIGN PATENT DOCUMENTS

| | | |
|---|---|---|
| JP | H01296673 A | 11/1989 |
| KR | 100639201 B1 | 10/2006 |
| KR | 101337615 B1 | 12/2013 |

OTHER PUBLICATIONS

S.P. DenBaars et al., "Atomic Layer Epitaxy of Compound Semiconductors With Metalorganic Precursors," Journal of Crystal Growth 98 (1989) 195-208.
E.F. Schubert, "Doping in III-V Semiconductors," Cambridge University Press, pp. 288-289, AT&T 1993.
S.P. DenBaars et al., "GaAs/AlGaAs quantum well lasers with active regions grown by atomic layer epitaxy," Appl. Phys. Lett. 51(19) 1530-1532 (Nov. 1987).
S.P. DenBaars et al., "Atomic Layer Epitaxy for the Growth of Heterostructures," International Electron Devices Meeting, 1988 (IEDM '88) Technical Digest, pp. 472-474 (Dec. 1988).
D. Cohen-Elias et al., "Formation of Sub-10 nm width InGaAs finFETs of 200 nm Height by Atomic Layer Epitaxy," 71st Annual Device Research Conference (DRC), Jun. 2013, pp. 1-2.
English Abstract of JP Patent Application JPH01296673A by Mizuta Masashi; NEC Corp. Nov. 30, 1989.
English Translation of KR Patent Application KR100639201B1 by Cha, Tae Ho et al.,; Hynix Semiconductor Oct. 31, 2006.
English Translation of KR Patent Application KR101337615B1 by Yoon, Eui Joon et al.,: Seoul Opto Device Co. Dec. 6, 2013.

* cited by examiner

*Primary Examiner* — Margaret G Moore
(74) *Attorney, Agent, or Firm* — Louis J. Percello; Michael J. Chang, LLC (57) ABSTRACT

In one aspect, a method for forming a doped III-V semiconductor material on a substrate includes the steps of: (a) forming a first monolayer on the substrate, wherein the first monolayer comprises at least one group III or at least one group V element; and (b) forming a doped second monolayer on a side of the first monolayer opposite the substrate, wherein the second monolayer comprises either i) at least one group V element if the first monolayer comprises at least one group III element, or ii) at least one group III element if the first monolayer comprises at least one group V element, wherein a dopant is selectively introduced only during formation of the second monolayer, and wherein steps (a) and (b) are performed using atomic layer epitaxy. Doped III-V semiconductor materials are also provided.

14 Claims, 4 Drawing Sheets

REDUCING AUTODOPING OF III-V SEMICONDUCTORS BY ATOMIC LAYER EPITAXY (ALE)

FIELD OF THE INVENTION

The present invention relates to doping of III-V semiconductor materials, and more particularly, to techniques for reducing autodoping of III-V semiconductor materials using atomic layer epitaxy (ALE).

BACKGROUND OF THE INVENTION

Making an Ohmic contact to a semiconductor can be challenging. One factor for controlling the contact resistivity is to ensure that the interface (e.g., between the metal and the semiconductor material) is as clean as possible. Thus proper surface cleaning and preparation steps can be implemented prior to depositing the metal over the semiconductor.

Another factor for improving the contact resistivity is to increase the amount of doping in the semiconductor material. Doping can be used to narrow the Schottky barrier that is formed at the metal-semiconductor interface so carriers can tunnel through the barrier. Doping of III-V materials can, however, present some notable challenges. Namely, when doping a III-V material there is generally a preference as to whether the dopant substitutes a group III atom or a group V atom in the material. However, since III-V materials contain both group III and group V elements, it is not always easy to predict which atoms (group III or group V) the dopant will replace.

For instance, most commonly used n-type dopants for III-V materials systems are group IV elements such as silicon (Si) and tin (Sn). The group IV dopants are known as amphoteric dopants since they can occupy a group-III site and provide an electron (i.e., an n-type dopant) or they can occupy a group-V site and "give a hole" (i.e., a p-type dopant). Considering the example of the III-V material indium gallium arsenide (InGaAs), at low doping levels Si will be an n-type dopant (occupying group-III sites). However, as more Si is added to the InGaAs, the Si atoms will also populate group-V sites and auto-compensate (counter dope) the InGaAs. As a result, it is experimentally observed that at doping levels of about $1 \times 10^{19}$ to $3 \times 10^{19}$ cm$^{-3}$, the carrier concentration is saturated even if more Si (chemical doping) is added to InGaAs.

Thus, III-V semiconductor material growth techniques that reduce auto-compensation would be desirable.

SUMMARY OF THE INVENTION

The present invention provides techniques for reducing autodoping of III-V semiconductor materials using atomic layer epitaxy (ALE). In one aspect of the invention, a method for forming a doped III-V semiconductor material on a substrate is provided. The method includes the steps of: (a) forming a first monolayer on the substrate, wherein the first monolayer comprises at least one group III or at least one group V element; and (b) forming a doped second monolayer on a side of the first monolayer opposite the substrate, wherein the second monolayer comprises either i) at least one group V element if the first monolayer comprises at least one group III element, or ii) at least one group III element if the first monolayer comprises at least one group V element, wherein a dopant is selectively introduced only during formation of the second monolayer, and wherein steps (a) and (b) are performed using atomic layer epitaxy.

In another aspect of the invention, another method for forming a doped III-V semiconductor material on a substrate is provided. The method includes the steps of: (a) forming a first monolayer on the substrate, wherein the first monolayer comprises at least one group III or at least one group V element; and (b) forming a doped second monolayer on a side of the first monolayer opposite the substrate by first depositing a dopant onto the first monolayer and then depositing either i) at least one group V element if the first monolayer comprises at least one group III element, or ii) at least one group III element if the first monolayer comprises at least one group V element onto the first monolayer, wherein steps (a) and (b) are performed using atomic layer epitaxy.

In yet another aspect of the invention, a doped III-V semiconductor material is provided. the doped III-V semiconductor material includes at least one first monolayer, wherein the at least one first monolayer comprises only group V atoms; and at least one second monolayer on the at least one first monolayer, wherein the at least one second monolayer comprises only group III atoms and dopant atoms, such that the dopant atoms occupy only group III sites in the doped III-V semiconductor material.

A more complete understanding of the present invention, as well as further features and advantages of the present invention, will be obtained by reference to the following detailed description and drawings.

DETAILED DESCRIPTION OF PREFERRED EMBODIMENTS

Provided herein are atomic layer epitaxy (ALE)-based techniques for both forming and in-situ doping a III-V semiconductor material, wherein the III-V semiconductor material is grown layer-by-layer, and wherein the dopant is selectively introduced during (or immediately before) formation of a particular one of the layers for which in-situ doping is desired. As provided above, with amphoteric dopants such as group IV dopants, it can be difficult to control whether the dopant occupies a group-III site or a group-V site since auto-compensation can occur. Advantageously, with the present techniques, the dopant is selectively introduced when there is only either group-III or group-V sites available (but not both) thus effectively forcing the dopant to occupy a particular site, and generally eliminating the possibility for auto-compensation to occur.

To use a simple example to illustrate this concept, if a layer containing a group V element(s) (a group V layer) is formed separately from another layer containing a group III element(s) (a group III layer), then in order to achieve n-type ($n^{++}$) doping, the dopant can be selectively introduced only during growth of the group III layer. The dopant will thus be forced to occupy group-III sites since only group III vacancies are available to be populated with the dopant atom at the time of doping.

Figure 1:
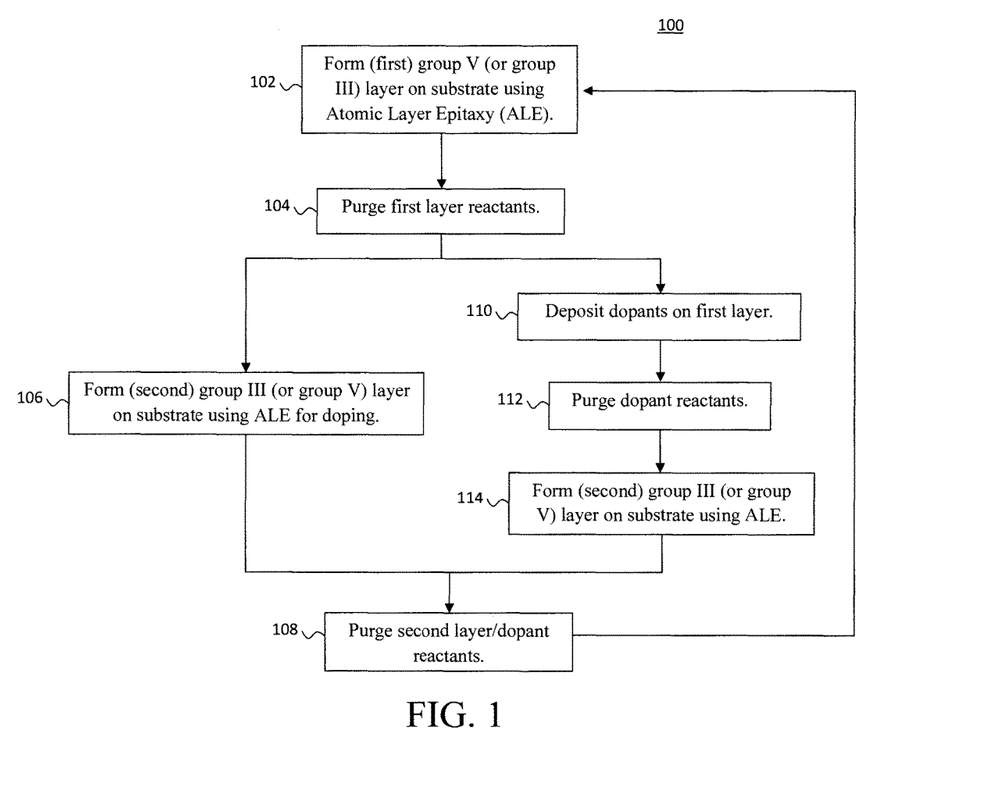
FIG. 1 is a diagram illustrating an exemplary methodology for forming a doped III-V semiconductor material on a substrate according to an embodiment of the present invention.

A general overview of the present techniques is now provided by way of reference to FIG. 1 which illustrates an exemplary methodology 100 for forming a doped III-V semiconductor material on a substrate. The term III-V semiconductor material (or simply III-V material), as used herein, refers to a material that includes at least one group III element and at least one group V element from the periodic table of elements. By way of example only, suitable III-V materials include, but are not limited to, one or more of aluminum gallium arsenide (AlGaAs), aluminum gallium nitride (AlGaN), aluminum indium arsenide (AlInAs), aluminum nitride (AlN), gallium antimonide (GaSb), gallium arsenide (GaAs), gallium nitride (GaN), indium antimonide (InSb), indium arsenide (InAs), indium gallium arsenide (InGaAs), indium gallium nitride (InGaN), indium nitride (InN), indium phosphide (InP) and combinations including at least one of the foregoing materials. According to an exemplary embodiment, the III-V material is InGaAs. Likewise, reference will be made herein to group IV dopants. These are elements selected from group IV of the periodic table, such as silicon (Si) and tin (Sn).

III-V semiconductor materials can be grown on a variety of different substrates. According to an exemplary embodiment, the III-V semiconductor material ($In_{0.53}Ga_{0.47}As$) is grown on a lattice-matched substrate, such as an indium phosphide (InP) substrate.

In step 102, ALE is used to grow a first (either group III or group V) monolayer on the substrate. In general, each of the layers in methodology 100 is grown using ALE to form monolayers typically one atom thick. According to an exemplary embodiment, the steps of methodology 100 are carried out in a reaction vessel which separates the reactants either spatially (e.g., by way of a multi-chamber reactor design) or temporally. See, for example, S. P. DenBaars et al., "Atomic Layer Epitaxy of Compound Semiconductors With Metalorganic Precursors," Journal of Crystal Growth 98 (1989) 195-208 (hereinafter "DenBaars"), the contents of which are incorporated by reference as if fully set forth herein, for a description of suitable reactor designs that may be used in accordance with the present techniques. In general, the III-V semiconductor material will be grown monolayer-by-monolayer. After each individual monolayer is grown, excess reactants are removed/purged (e.g., using an inert gas such as hydrogen $H_2$). Further, as will be described in detail below, doping will be performed in situ—i.e., during growth of a particular monolayer(s).

The first monolayer grown on the substrate is either a group III element-containing monolayer (or simply "a group III layer") (i.e., a monolayer containing one or more group III elements—and no group V elements) or a group V element-containing monolayer (or simply "a group V layer") (i.e., a monolayer containing one or more group V elements—and no group III elements). Namely, in order to be able to direct the dopant to either group III or group V sites, in this example, the group III elements and the group V elements are separated into different monolayers—and the dopant is applied (directed) only during deposition of either the group III monolayer or group IV monolayer, rather than being available all the time during the crystal growth.

According to an exemplary embodiment, the (first) monolayer grown in step 102 is a group V layer. What is important however is that the first monolayer grown (whether it be a group III or a group V layer) is different (in terms of whether it contains group III or group V elements) from the second monolayer grown, and vice versa. Thus, if the first monolayer grown (in step 102) is a group V layer, then the second layer grown (see below) should be a group III layer, and vice versa. As provided above, this will ensure that doping will occur at the desired (group V or group III) sites.

By way of example only, step 102 may be carried out by contacting the substrate with a source (or sources) of group III or group V atoms under conditions (e.g., temperature, duration, etc.) sufficient to form the first (either group III or group V) layer on the substrate. Sources for vapor phase epitaxy of group III-V materials such as indium (In), gallium (Ga), arsenic (As), aluminum (Al), antimony (Sb), nitrogen (N), etc. are known in the art. See, for example, DenBaars. By way of example only, trimethylindium, trimethylgallium (or triethylgallium), and trimethylaluminum TMAl are suitable organometallic sources for vapor phase epitaxy of group III elements indium, gallium, and aluminum, respectively. Tertiary butyl arsine (TBA) is a suitable source for vapor phase epitaxy of the group V element As, tertiary butyl phosphine (TBP) is a suitable source for vapor phase epitaxy of the group V element phosphorous (P), trimethylantimony TMSb and triethylantimony TESb are suitable sources for vapor phase epitaxy of the group V element antimony (Sb), and ammonia $NH_3$ and hydrazine $N_2H_4$ are suitable sources for vapor phase epitaxy of the group V element nitrogen (N).

By way of example only, in step 102 the substrate can be contacted with the group III or group V source(s) at a temperature of from about 350° C. to about 500° C., and ranges therebetween, for a duration of from about 1 second to about 20 seconds, and ranges therebetween.

Following formation of the first (either group III or group V) monolayer on the substrate, in step 104 excess reactants are flushed or purged leaving behind the corresponding group III or group V atoms. See, for example, DenBaars. According to an exemplary embodiment, this purging involves contacting the sample with an inert gas flow under conditions sufficient to flush/purge any of the remaining reactants (e.g., methyl radicals in the case of TBA/TBP). Suitable inert gases include, but are not limited to, hydrogen ($H_2$) gas. By way of example only, in step 104 the sample can be contacted with the inert gas flow at a temperature of from about 350° C. to about 500° C., and ranges therebetween, for a duration of from about 1 second to about 20 seconds, and ranges therebetween, with a gas flow rate of from about 1 standard cubic centimeters per minute (sccm) to about 200 sccm, and ranges therebetween. It is generally desirable to keep the temperature constant during the growth (e.g., a constant temperature of from about 350° C. to about 500° C., and ranges therebetween, is employed throughout each growth and purge step in the process). Further, a low temperature growth process—such as that described herein—advantageously avoids dopant diffusion. As described in DenBaars, the gas phase decomposition of III-V material sources such as tertiary butyl arsine, trimethylindium and trimethylgallium occurs in multiple stages. Upon deposition two methyl radicals are lost. However, higher temperatures are needed to shed the third methyl radical. Accordingly, elevated temperatures are employed during the purge in step 104 (as compared, e.g., to step 102).

In this example, the next task will be to grow (and in situ dope) a second monolayer on the first monolayer. This can be carried out in a number of different ways. In one exemplary embodiment, a dopant source is introduced along with the source(s) of the components for the second monolayer (see step 106—described below). Alternatively, the dopant can be introduced separately from (e.g., prior to) the components for the second monolayer, and become incorporated during growth of the second monolayer (see steps 110-114—described below). This alternative scenario permits a maximum amount of doping to be achieved since the dopant atoms will have less competition for sites to occupy in the second monolayer.

Each of these doping scenarios will now be described in detail. According to the first scenario, in step 106 a second monolayer is formed on the first monolayer wherein a dopant source is added along with the source(s) of the components for ALE growth of the second layer. As provided above, the second monolayer is preferably different (in terms of whether it contains group III or group V atoms) from the first monolayer. Thus, if the first monolayer is a group V layer, then the second monolayer should be a group III layer, and vice versa. By segregating the monolayers in this manner, the dopant (when selectively introduced) will then be directed to occupy only group III or group V sites—whichever is available.

Preferably, the dopant is a group IV dopant such as silicon (Si), tin (Sn), germanium (Ge), or carbon (C). By way of example only, Si, Sn, and Ge are suitable n-type dopants, and C is a suitable p-type dopant. As provided above, group IV dopants are amphoteric as they can occupy either group III or group V sites. Thus group IV dopants can be employed in accordance with the present techniques whether the second monolayer is a group III layer (having group III sites) or a group V layer (having group V sites). In the example provided above, the first monolayer formed is a group V layer. In that case, the second monolayer would be a group III layer. Thus, the dopant introduced in step 106 would occupy group III sites in the second (group III) monolayer. Alternatively, if the first monolayer formed is instead a group III layer, then the second monolayer would be a group V layer and the dopant introduced in step 106 would occupy group V sites in the second (group V) monolayer.

In either case, step 106 may be carried out by contacting the substrate/first monolayer with a source(s) of group III or group V atoms and a source of group IV dopant atoms under conditions sufficient to form an in situ doped second (either group III or group V) monolayer on a side of the first monolayer opposite the substrate. As provided above, sources for vapor phase epitaxy of group III-V materials are known in the art. By way of example only, trimethylindium and trimethylgallium are suitable organometallic sources for vapor phase epitaxy of In and Ga, respectively, and TBA and TBP are suitable sources for vapor phase epitaxy of As and P, respectively. Trimethylsilane, silane ($SiH_4$), disilane ($SiH_6$), silicon tetrabromide ($SiBr_4$) and silicon tetrachloride, for example, are suitable sources for vapor phase epitaxy of the dopant Si. Tetraethyltin $Sn(C_2H_5)_4$ and tetramethyltin $Sn(CH_3)_4$, for example, are suitable sources for vapor phase epitaxy of the dopant Sn. Germane $GeH_4$ is a suitable source for vapor phase epitaxy of the dopant Ge. Carbon tetrabromide ($CBr_4$) is a suitable source for vapor phase epitaxy of the dopant C. By way of example only, in step 106 the substrate can be contacted with the group III or group V, and dopant source(s) at a temperature of from about 350° C. to about 500° C., and ranges therebetween, for a duration of from about 1 second to about 20 seconds, and ranges therebetween. By way of example only, if an n-type doped III-V semiconductor material is desired, then in step 106 the substrate/first monolayer may be contacted with a source(s) of group III atoms and a source of Si, Sn, or Ge as the dopant. Alternatively, if a p-type doped III-V semiconductor material is desired, then in step 106 the substrate/first monolayer may be contacted with a source(s) of group V atoms and a source of C as the dopant. For instance, if a p-type InGaAs layer is desired carbon doping may be achieved by practicing ALE cycles of 10 second TMGa/TMI, 10 second $H_2$ purge, 10 second TBAs and carbon tetrabromide ($CBr_4$), and a 10 second $H_2$ purge It is notable that multiple group III (or group V) elements can be introduced together in step 102 and/or in step 106, so long as there is no intermixing of group III and group V elements in the same monolayer. For instance, to use n-type ($n^{++}$) InGaAs as an example, sources of both In and Ga (e.g., trimethylindium and trimethylgallium) can be introduced together in step 106 (along with the dopant). Alternatively, embodiments are presented herein where the elements of a ternary III-V material are introduced individually in separate steps.

Following formation of the doped second (either group III or group V) monolayer on the first monolayer, in step 108 excess reactants are again flushed or purged. As above, the purging can involve contacting the sample with an inert gas (e.g., $H_2$ gas) flow under conditions sufficient to flush (purge) excess reactants from the chamber (e.g., methyl radicals in the case of TMIn, TMGa, $SiH_4$, $GeH_4$, etc.) leaving behind the corresponding group III or group V and dopant atoms. By way of example only, in step 108 the sample can be contacted with the inert gas flow at a temperature of from about 350° C. to about 500° C., and ranges therebetween, for a duration of from about 1 second to about 20 seconds, and ranges therebetween, with a gas flow rate of from about 1 sccm to about 200 sccm, and ranges therebetween.

Alternatively, the dopant and the components for the second monolayer may be introduced in separate steps. Namely, the dopant atoms may be deposited onto the first monolayer followed by growth of the second monolayer (during which the dopant atoms become incorporated in the second monolayer). See steps 110-114. Specifically, the second monolayer is grown on the first monolayer in multiple steps using ALE by first (in step 110) depositing a discontinuous monolayer of dopant atoms on the first monolayer substrate. By way of example only, step 110 may be carried out by contacting the substrate/first monolayer with a source of (e.g., group IV) dopant atoms under conditions sufficient to form a non-continuous monolayer of dopant atoms on a side of the first monolayer opposite the substrate. Suitable sources for vapor phase epitaxy of group IV dopants (such as Si, Sn, Ge, and C) were provided above. By way of example only, in step 110 the substrate can be contacted with the dopant source at a temperature of from about 350° C. to about 500° C., and ranges therebetween, for a duration of from about 1 second to about 20 seconds, and ranges therebetween. The reason that the dopant atoms may not form a continuous monolayer is due to strain energy and electronic energy effects. See, for example, E. F. Schubert, "Doping in III-V Semiconductors," Cambridge University Press, pgs. 288-289, AT&T 1993, the contents of which are incorporated by reference as if fully set forth herein. Namely, when doping levels are in the percentage range (e.g., are a percent of the total atoms in the alloy) strain effects are significant (since the donor atom size is typically different than In, Ga or As). Additional bonding becomes energetically unfavorable due to the strain energy. Similarly when the doping level (or more accurately the number of free electrons) becomes high the electronic energy increases since the difference between the Fermi level and the donor level becomes larger. Adding more electrons becomes energetically less favorable. This is the reason the group IV dopants exhibit an amphoteric behavior. Both the increase in strain energy and electronic energy will typically prevent the formation of a full monolayer of the donor (or acceptor).

Following formation of the dopant layer on the substrate, in step 112 excess dopant reactants are removed, e.g., flushed or purged. As described, for example, in conjunction with the description of steps 104 and 108, above, the purging can involve contacting the sample with an inert gas (e.g., $H_2$ gas) flow under conditions sufficient to flush (purge) excess reactants from the chamber (e.g., methyl radicals in the case of trimethylsilane or tetraethyltin) leaving behind the corresponding group IV and dopant atoms. By way of example only, in step 112 the sample can be contacted with the inert gas flow at a temperature of from about 350° C. to about 500° C., and ranges therebetween, for a duration of from about 1 second to about 20 seconds, and ranges therebetween, with a gas flow rate of from about 1 sccm to about 200 sccm, and ranges therebetween.

An advantage to this alternative doping scheme is that since the dopant atoms are being deposited first, they do not have to compete for sites in the second monolayer. By comparison, in the first scenario (see step 106—described above) the dopant atoms will compete with the group III or group V atoms for sites in the second monolayer.

Next, in step 114 group III or group V atoms are added to complete the second monolayer. Step 114 may be carried out by contacting the substrate/first monolayer/non-continuous monolayer of dopant atoms with a source(s) of group III or group V atoms under conditions sufficient to form an in situ doped second (either group III or group V) monolayer on a side of the first monolayer opposite the substrate. By way of example only, in step 114 the substrate/first monolayer/non-continuous monolayer of dopant atoms can be contacted with the group III or group V source(s) at a temperature of from about 350° C. to about 500° C., and ranges therebetween, for a duration of from about 1 second to about 20 seconds, and ranges therebetween. A purge is then performed in step 108 to remove/flush excess reactants. The details of step 108 were provided above.

As shown in FIG. 1, multiple iterations of the process may be performed. This may be done for instance when the elements of a ternary III-V material are introduced individually in separate steps. An example of this scenario is provided below wherein multiple group III elements are deposited individually into different monolayers (i.e., first, second, third, fourth, etc. monolayers).

It is to be understood that the steps described herein may be applied in any order and/or combined in a manner not explicitly shown or described in the figures. For instance, while examples are provided herein that place the dopant atoms in the second, fourth, etc. (even number) monolayers, one might also (in the same manner described) place a dopant in the first, third, etc. (odd number) monolayers. By way of example only, if one wanted to make a p-type doping using carbon, then the first monolayer could be a group V layer with carbon, the second monolayer could be a group III monolayer, and the third monolayer could be another group V layer with carbon doping.

Advantageously, by way of the present ALE-based doping techniques a greater free carrier concentration can be obtained in the resulting epitaxial layer as compared to conventional processes. For instance, with an epitaxial layer resulting from the present process a free carrier concentration originated from the dopants in the layer is generally greater than $6 \times 10^{19}$ $cm^{-3}$ (as compared, e.g., to conventional process which can achieve at most a free carrier concentration of up to $6 \times 10^{19}$ $cm^{-3}$).

Given the above general description, specific implementations will now be provided. While the following examples focus on the formation of a specific III-V material, namely InGaAs, they serve to further illustrate the above-described techniques.

Figure 2:
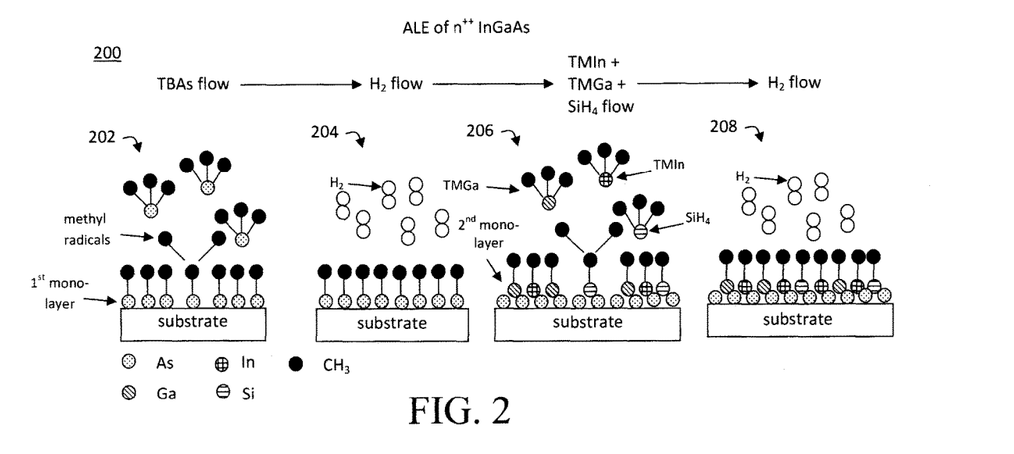
FIG. 2 is a diagram illustrating an exemplary methodology for forming n$^{++}$ InGaAs on a substrate using ALE according to an embodiment of the present invention.

Turning now to FIG. 2, an exemplary methodology 200 is provided for forming n-type doped InGaAs ($n^{++}$ InGaAs) on a substrate using ALE. As provided above, III-V semiconductor materials can be grown on a variety of different substrates. According to an exemplary embodiment, the $n^{++}$ InGaAs layer in this example is grown to be lattice-matched to an InP substrate.

Generally, in the schematic representations provided in FIGS. 2-5 shading and patterning are used to differentiate different elements/compounds. A key is given at the bottom left of each figure. For instance, solid black circles are used to represent methyl compounds, a checkered pattern is used to represent In atoms, a hashed pattern is used to represent Ga atoms, a dotted pattern is used to represent As atoms, a horizontal line pattern is used to represent Si atoms, etc.

In step 202, a first monolayer of group V atoms is formed on the substrate. Specifically, in this example the substrate is contacted with a flow of tertiary butyl arsine (TBA). As provided above, TBA is a source for vapor phase epitaxy of the group V element As. Suitable conditions for forming the first monolayer on the substrate were provided in conjunction with the description of step 102 of FIG. 1, above.

As also provided above, the gas phase decomposition of III-V material sources such as TBA, TBP, trimethylindium and trimethylgallium generally occurs in multiple stages. Namely, upon deposition two methyl radicals are lost. See FIG. 2—labeled "methyl radicals." However, further processing is needed to shed the third methyl radical. Specifically, a purge is performed in step 204 to remove excess reactants (including the third methyl radical—compare step 204 with step 206). Suitable conditions for the purging step (including the elevated temperatures needed to shed the third methyl radical) were provided in conjunction with the description of step 104 of FIG. 1, above.

Next, in step 206 a second monolayer of group III and group IV dopant atoms is formed on a side of the first monolayer opposite the substrate. Specifically, in this example the substrate/first monolayer is contacted with a flow of trimethylindium (TMIn), trimethylgallium (TMGa), and silane ($SiH_4$). As provided above, TMIn is a source for vapor phase epitaxy of the group III element In, TMGa is a source for vapor phase epitaxy of the group III element Ga, and $SiH_4$ is a source for vapor phase epitaxy of the group IV dopant Si. Suitable conditions for forming the second monolayer on the first monolayer were provided in conjunction with the description of step 106 of FIG. 1, above.

In step 208, a purge is again performed to remove excess reactants. Suitable conditions for the purging step were provided in conjunction with the description of step 108 of FIG. 1, above.

Figure 3:
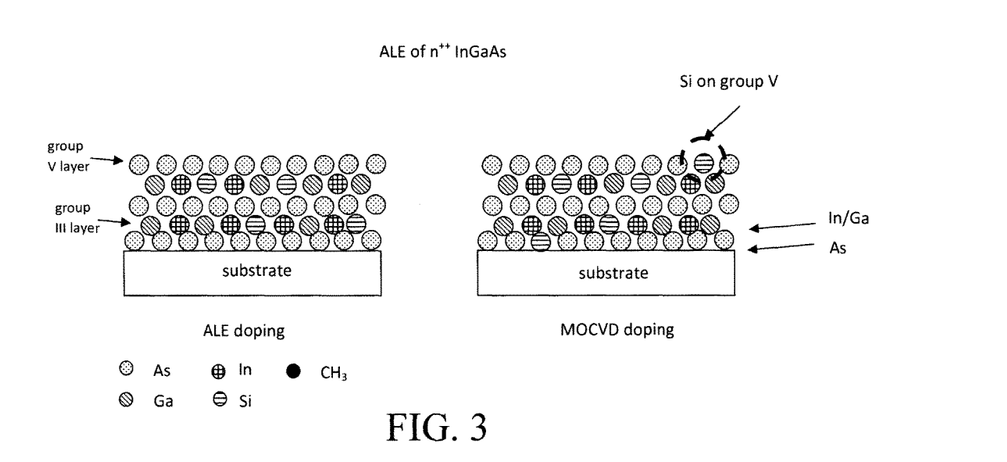
FIG. 3 is a diagram illustrating advantages of the present ALE-based doping techniques as compared to conventional processes such as metalorganic vapor phase chemical vapor deposition (MOCVD) according to an embodiment of the present invention.

FIG. 3 is a diagram illustrating advantages of the present ALE-based doping techniques as compared to conventional processes such as metalorganic vapor phase chemical vapor deposition (MOCVD). An example of sample prepared using the present techniques is shown on the left in FIG. 3 (labeled "ALE doping"), and an example showing a sample prepared using MOCVD is shown on the right in FIG. 3 (labeled "MOCVD doping"). As shown in FIG. 3, with the ALE sample the Si dopant atoms are present only in the monolayers containing group III atoms. Namely, in this example the Si dopants are directed, by way of the present techniques, to occupy only group III sites. As described in detail above, this is due to segregation of the group III and group V atoms into separate monolayers, and the selective introduction of the dopants only when group III sites are available.

By comparison, in the MOCVD sample Si dopant atoms occupy both group III and group V sites which can occur based on the amphoteric nature of group IV dopants when both group III and group V sites are available. As provided above, this result is disadvantageous due to its counter-doping effect.

As provided above, the dopant can (optionally) be introduced separately (e.g., prior to) the other constituents which affords a greater amount of doping since the dopant atoms are not competing for sites in the monolayer. An example of this scenario is depicted in FIG. 4.

Figure 4:
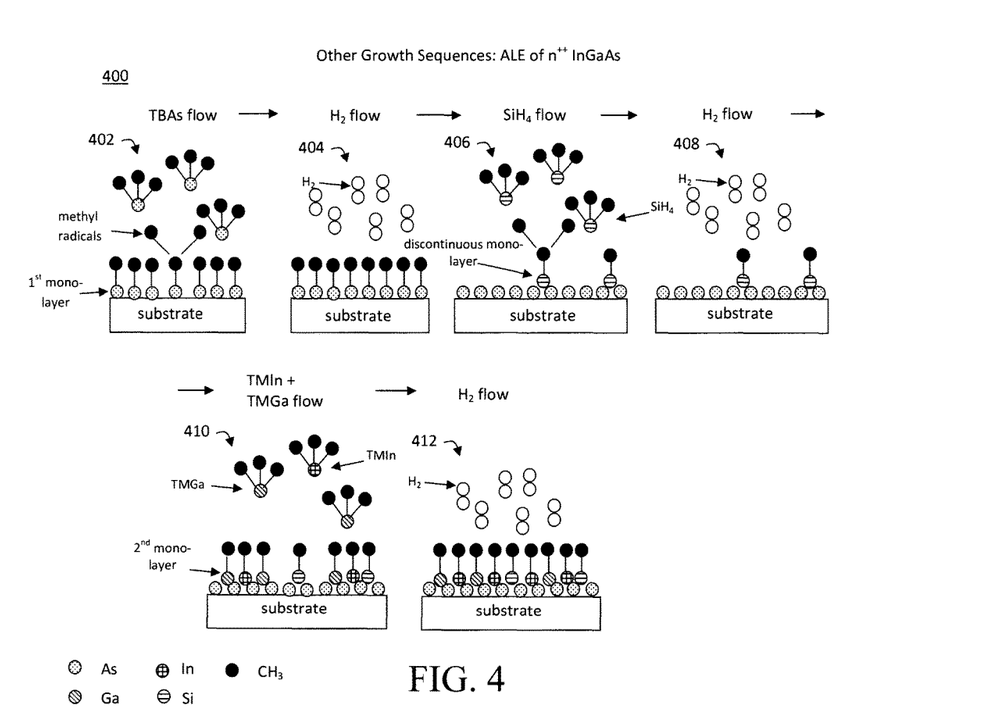
FIG. 4 is a diagram illustrating an exemplary methodology for forming n$^{++}$ InGaAs on a substrate using ALE wherein the dopant is introduced separately from the group III constituents according to an embodiment of the present invention.

FIG. 4 provides an exemplary methodology 400 for forming $n^{++}$ InGaAs on a substrate using ALE wherein the dopant is introduced separately from the group III constituents. As provided above, III-V semiconductor materials can be grown on a variety of different substrates. According to an exemplary embodiment, the $n^{++}$ InGaAs layer in this example is grown to be lattice-matched to an InP substrate.

In step 402, a first monolayer of group V atoms is formed on the substrate. Specifically, in this example the substrate is contacted with a flow of TBA. As provided above, TBA is a source for vapor phase epitaxy of the group V element As. Suitable conditions for forming the first monolayer on the substrate were provided in conjunction with the description of step 102 of FIG. 1, above.

A purge is then performed in step 404 to remove excess reactants (including the third remaining methyl radical—see above). Suitable conditions for the purging step were provided in conjunction with the description of step 104 of FIG. 1, above.

Next, the dopant and the components for the second monolayer are, in this example, introduced in separate steps. Namely, the dopant atoms are deposited onto the first monolayer followed by growth of the second monolayer (during which the dopant atoms become incorporated in the second monolayer). See steps 406-410. Specifically, the second monolayer is grown on the first monolayer in multiple steps using ALE by first (in step 406) depositing a discontinuous monolayer of dopant atoms on a side the first monolayer opposite the substrate. Specifically, in this example the substrate/first monolayer is contacted with a flow of silane ($SiH_4$). As provided above, $SiH_4$ is a source for vapor phase epitaxy of the group IV dopant Si. Trimethylsilane may also be used as a source for Si doping. Suitable conditions for forming the discontinuous monolayer of dopant atoms on the first monolayer were provided in conjunction with the description of step 110 of FIG. 1, above.

In step 408, a purge is performed to remove excess (dopant) reactants. Suitable conditions for the purging step were provided in conjunction with the description of step 112 of FIG. 1, above.

In step 410, group III atoms are added to complete the second monolayer. Specifically, in this example the substrate/first monolayer/discontinuous dopant monolayer is contacted with a flow of trimethylindium (TMIn) and trimethylgallium (TMGa). As provided above, TMIn is a source for vapor phase epitaxy of the group III element In, and TMGa is a source for vapor phase epitaxy of the group III element Ga. Suitable conditions for completing growth of the second monolayer on the first monolayer were provided in conjunction with the description of step 114 of FIG. 1, above.

Finally, in step 412, a purge is performed to remove excess reactants. Suitable conditions for the purging step were provided in conjunction with the description of step 108 of FIG. 1, above.

The above description of the method was provided with the assumption that the growth of the epitaxial layer is taking place "layer by layer," where a group V monolayer is followed by a group III monolayer. Such a description is true for a crystallographic oriented (100) surface. However, for some crystallographic orientations both group III and group V elements are present in each monolayer. For example, when the disclosed method of FIG. 4 is applied to the growth of a (110) oriented surface, a group V precursor is first applied to attach the group V atoms to all of the available group III atoms. Following a purge, an n-type dopant precursor is applied to attach the dopant atoms to the vacant group III sites. Following a purge a group III precursor is applied to fill the remaining vacant group III sites. It is noted that the dopant precursor and the group III precursor can be applied together as discussed for the method of FIG. 2.

As provided above, in accordance with the present techniques, the elements of a ternary III-V material may be introduced individually in separate steps. For instance, each group III and group V element may be deposited individually into different monolayers (i.e., first, second, third, fourth, etc. monolayers). An example of this scenario is depicted in FIG. 5.

Figure 5:
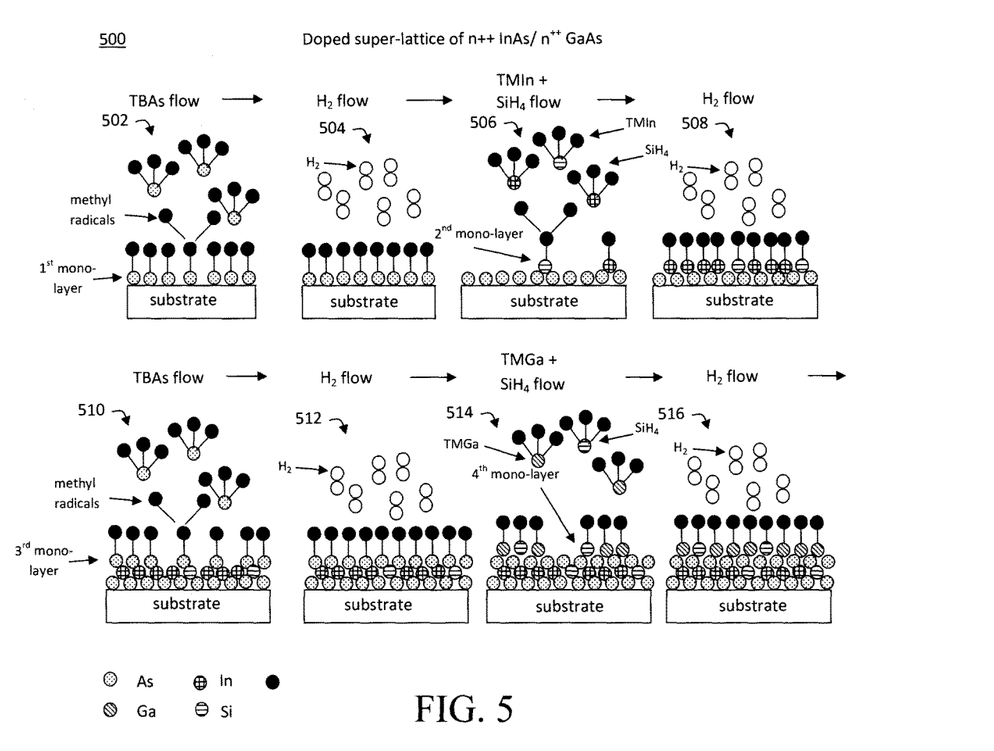
FIG. 5 is a diagram illustrating an exemplary methodology for forming n$^{++}$ InGaAs on a substrate using ALE wherein the group III and group V elements are each introduced individually in separate monolayers according to an embodiment of the present invention.

FIG. 5 provides an exemplary methodology 500 for forming $n^{++}$ InGaAs on a substrate using ALE wherein the group III and group V elements are each introduced individually in separate monolayers. As provided above, III-V semiconductor materials can be grown on a variety of different substrates. According to an exemplary embodiment, the $n^{++}$ $In_{0.5}Ga_{0.5}As$ layer in this example is grown slightly mismatched to an InP substrate by growing alternating monolayers of InAs/GaAs. In order to obtained exact lattice-matching with the InP substrate, a composition of 53% indium and 47% gallium is needed ($In_{0.53}Ga_{0.47}As$). Other III-V semiconductors such as $In_{0.5}Ga_{0.5}P$ which are exactly lattice-matched to a GaAs substrate may also be grown by making alternating monolayers of InP/GaP. In yet another example, $In_{0.5}Al_{0.5}As$ can be grown latticed matched to InP by making alternating mono-layers of InAs/AlAs.

In step 502, a first monolayer of group V atoms is formed on the substrate. Specifically, in this example the substrate is contacted with a flow of TBA. As provided above, TBA is a source for vapor phase epitaxy of the group V element As. Suitable conditions for forming the first monolayer on the substrate were provided in conjunction with the description of step 102 of FIG. 1, above.

A purge is then performed in step 504 to remove excess reactants (including the third remaining methyl radical—see above). Suitable conditions for the purging step were provided in conjunction with the description of step 104 of FIG. 1, above.

Next, in step 506 a second monolayer of group III and group IV dopant atoms is formed on a side of the first monolayer opposite the substrate. Specifically, in this example the substrate/first monolayer is contacted with a flow of trimethylindium (TMIn) and silane (SiH$_4$) or trimethylsilane. As provided above, TMIn is a source for vapor phase epitaxy of the group III element In, and SiH$_4$ is a source for vapor phase epitaxy of the group IV dopant Si. Suitable conditions for forming the second monolayer on the first monolayer were provided in conjunction with the description of step 106 of FIG. 1, above.

In step 508, a purge is again performed to remove excess reactants. Suitable conditions for the purging step were provided in conjunction with the description of step 108 of FIG. 1, above.

The process is then repeated (see, for example, the description FIG. 1 above wherein it is described how multiple iterations of methodology 100 may be performed) to form third, fourth, etc. monolayers. Namely, in step 510 a third monolayer of group V atoms is formed on a side of the second monolayer opposite the first monolayer. Specifically, in this example the substrate/first monolayer/second monolayer is again contacted with a flow of TBA. Suitable conditions for forming the first monolayer on the substrate were provided in conjunction with the description of step 102 of FIG. 1, above.

A purge is then performed in step 512 to remove excess reactants. Suitable conditions for the purging step were provided in conjunction with the description of step 104 of FIG. 1, above.

Next, in step 514 a fourth monolayer of group III and group IV dopant atoms is formed on a side of the third monolayer opposite the second monolayer. Specifically, in this example the substrate/first monolayer/second monolayer/third monolayer is contacted with a flow of trimethylgallium (TMGa) and silane (SiH$_4$) or trimethylsilane. As provided above, TMGa is a source for vapor phase epitaxy of the group III element Ga, and SiH$_4$ is a source for vapor phase epitaxy of the group IV dopant Si. Suitable conditions for forming the fourth monolayer on the third monolayer were provided in conjunction with the description of step 106 of FIG. 1, above.

Finally, in step 516, a purge is again performed to remove excess reactants. Suitable conditions for the purging step were provided in conjunction with the description of step 108 of FIG. 1, above. In this example a super-lattice, i.e., a periodic structure of layers of two (or more) materials, is formed. Basically, in this case a lattice is formed of alternating monolayers of InAs/GaAs. This super-lattice has ordering which is not the same as In0.5Ga0.5As which is an alloy where the In and Ga locations are random, but on the average there is 50% In and 50% Ga.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a doped III-V semiconductor material on a substrate, the method comprising the steps of:
   (a) forming a first monolayer on the substrate, wherein the first monolayer comprises at least one group III or at least one group V element; and
   (b) forming a doped second monolayer on a side of the first monolayer opposite the substrate, wherein the second monolayer comprises either i) at least one group V element if the first monolayer comprises at least one group III element, or ii) at least one group III element if the first monolayer comprises at least one group V element, wherein a dopant is selectively introduced only during formation of the second monolayer, wherein steps (a) and (b) are performed using atomic layer epitaxy, and wherein the step (a) comprises the steps of:
   contacting the substrate with at least one group III or at least one group V element vapor phase epitaxy source under conditions sufficient to form the first monolayer on the substrate;
   and purging any remaining reactants, wherein the purging is performed using an inert gas flow, and wherein the inert gas flow comprises a hydrogen gas flow.

2. The method of claim 1, wherein the substrate comprises an indium phosphide substrate.

3. The method of claim 1, wherein the conditions comprise a temperature of from about 350° C. to about 500° C., and ranges therebetween, and a duration of from about 1 second to about 20 seconds, and ranges therebetween.

4. The method of claim 1, wherein the III-V semiconductor material comprises indium gallium arsenide (InGaAs) and, in the step (a), the substrate is contacted with at least one group V element vapor phase epitaxy source.

5. The method of claim 4, wherein the at least one group V element vapor phase epitaxy source comprises tertiary butyl arsine.

6. The method of claim 1, wherein the step (b) comprises the steps of:
   contacting the substrate with at least one group III or at least one group V element vapor phase epitaxy source and a source of the dopant under conditions sufficient to form the second monolayer on the substrate; and
   purging any remaining reactants.

7. The method of claim 6, wherein the conditions sufficient to form the second monolayer on the substrate comprise a temperature of from about 350° C. to about 500° C., and ranges therebetween, and a duration of from about 1 second to about 20 seconds, and ranges therebetween.

8. The method of claim 6, wherein the III-V semiconductor material comprises InGaAs and, in the step (b), the substrate is contacted with at least one group III element vapor phase epitaxy source.

9. The method of claim 8, wherein the at least one group III element vapor phase epitaxy source comprises either trimethylindium or trimethylgallium.

10. The method of claim 8, wherein the at least one group III element vapor phase epitaxy source comprises a combination of trimethylindium and trimethylgallium.

11. The method of claim 6, wherein the dopant comprises a group IV dopant.

12. The method of claim 11, wherein the group IV dopant comprises either i) an n-type dopant comprising silicon, tin, or germanium, or ii) a p-type dopant comprising carbon.

13. The method of claim 12, wherein the source of the dopant comprises trimethylsilane.

14. The method of claim 1, further comprising the step of:
   repeating steps (a) and (b) to form one or more additional monolayers.

* * * * *